(12) United States Patent  
Huang et al.

(10) Patent No.: US 7,005,720 B2  
(45) Date of Patent: Feb. 28, 2006

(54) SEMICONDUCTOR PACKAGE WITH PHOTOSENSITIVE CHIP AND FABRICATION METHOD THEREOF

(75) Inventors: Chien-Ping Huang, Taichung (TW); Cheng-Hsu Hsiao, Taichung (TW); Chih-Ming Huang, Taichung (TW)

(73) Assignee: Siliconware Precision Industries Co., Ltd., (TW)

( * ) Notice: Subject to any disclaimer, the term of this patent is extended or adjusted under 35 U.S.C. 154(b) by 33 days.

(21) Appl. No.: 10/763,656

(22) Filed: Jan. 23, 2004

(65) Prior Publication Data

US 2005/0161755 A1 Jul. 28, 2005

(51) Int. Cl.  
*H01L 21/00* (2006.01)  
*H01L 21/44* (2006.01)

(52) U.S. Cl. .................. 257/433; 257/432; 257/434; 257/680; 257/704; 438/48; 438/57; 438/60; 438/64

(58) Field of Classification Search ........ 257/432–435, 257/642, 680, 698, 704, 783, 713, 719; 438/48, 438/57, 60, 64, 69, 106, 108, 116  
See application file for complete search history.

(56) References Cited

U.S. PATENT DOCUMENTS 6,448,665 B1 * 9/2002 Nakazawa et al. .......... 257/789  
6,590,269 B1 * 7/2003 Chuang et al. ............. 257/432  
6,635,209 B1 * 10/2003 Huang ........................ 264/154

* cited by examiner

Primary Examiner—Donghee Kang  
(74) Attorney, Agent, or Firm—Peter F. Corless; Steven M. Jensen; Edwards Angell Palmer & Dodge LLP

(57) ABSTRACT

A semiconductor package with a photosensitive chip and a fabrication method thereof are provided. A substrate having a core is prepared. A solder mask layer is applied over a surface of the core and formed with an opening to expose a continuous peripheral portion on the surface of the core. At least one photosensitive chip is mounted on and electrically connected to the substrate. An encapsulation dam is formed on the continuous peripheral portion of the core and surrounds the chip. The dam includes a shoulder portion adjacent to and flush with the solder mask layer, and a protruded support portion surrounding the shoulder portion. A lid is attached to the support portion of the dam for sealing the dam such that the chip is received in a space defined by the substrate, the dam and the lid.

20 Claims, 6 Drawing Sheets

SEMICONDUCTOR PACKAGE WITH PHOTOSENSITIVE CHIP AND FABRICATION METHOD THEREOF

FIELD OF THE INVENTION

The present invention relates to semiconductor packages and fabrication methods thereof, and more particularly, to a semiconductor package incorporated with at least one photosensitive chip such as CMOS (complementary metal oxide semiconductor) chip, and a method for fabricating the semiconductor package.

BACKGROUND OF THE INVENTION

Semiconductor packages are electronic devices for accommodating active components such as semiconductor chips, whose structure is primarily composed of a chip mounted on a substrate and electrically connected to the substrate via conductive elements such as bonding wires; an encapsulation body is formed by a resin compound (such as epoxy resin, etc.) on the substrate to encapsulate the chip and bonding wires which are protected against external moisture and contaminant. The encapsulation body is usually opaque or non-transparent, thereby making a photosensitive chip such as CMOS (complementary metal oxide semiconductor) chip that requires light for operation not suitably incorporated in such a semiconductor package.

Accordingly, U.S. Pat. No. 6,590,269 provides a semiconductor package with a structurally modified encapsulation body for allowing light to reach the photosensitive chip with reference to FIG. 4. In this semiconductor package, the photosensitive chip 10 is mounted on a substrate 11 and electrically connected to the substrate 11 via a plurality of bonding wires 12. An encapsulation body 13 is formed on the substrate 11 by molding and shaped as a wall structure surrounding the chip 10 and bonding wires 12; this wall-shaped encapsulation body 13 forms a cavity 14 where the chip 10 and bonding wires 12 are received without being encapsulated by the encapsulation body 13. A lid 15 is mounted and supported by the encapsulation body 13 to seal the cavity 14 and hermetically isolate the chip 10 and bonding wires 12 from the external atmosphere. The lid 15 is made of a light-permeable or transparent material to allow light to go through the lid 15 and reach the chip 10 to facilitate operation of the chip 10. This thereby provides a package structure suitable for use with the photosensitive chip.

However, the above semiconductor package may undesirably suffer significant drawbacks. The encapsulation body formed on the substrate is attached to a layer of solder mask applied over the surface of the substrate. Since adhesion between the resin compound of the encapsulation body and the solder mask is not very strong and the contact area between the encapsulation body and the substrate is relatively small, thereby delamination between the encapsulation body and the substrate may easily occur, making the reliability of the semiconductor package degrade. Moreover, since the encapsulation body is molded onto the surface of the substrate, the resin compound may easily flash to unintended area on the substrate and contaminate bond fingers formed on the substrate during molding. As a result, bonding wires cannot be perfectly bonded to the contaminated bond fingers, such that electrical connection between the chip and the substrate is damaged.

Therefore, the problem to be solved herein is to provide a semiconductor package with a photosensitive chip, which can enhance adhesion between the encapsulation body and the substrate and prevent the occurrence of resin flash over the substrate.

SUMMARY OF THE INVENTION

An objective of the present invention is to provide a semiconductor package with a photosensitive chip and a fabrication method thereof, which can enhance adhesion between an encapsulation dam and a substrate on which the dam is formed, thereby preventing delamination in-between from occurrence.

Another objective of the present invention is to provide a semiconductor package with a photosensitive chip and a fabrication method thereof, which can eliminate a resin compound for forming the encapsulation dam from flashing over unintended area on the substrate, thereby assuring reliability and electrical connection of the semiconductor package.

In accordance with the foregoing and other objectives, the present invention proposes a semiconductor package with a photosensitive chip, including: a substrate having a core with a plurality of conductive traces formed on at least one surface of the core, each of the conductive traces having a terminal, wherein a solder mask layer is applied over the surface of the core and covers the conductive traces, allowing the terminals to be exposed to outside of the solder mask layer, and the solder mask layer is formed with an opening to expose a continuous peripheral portion on the surface of the core; at least one photosensitive chip mounted on the substrate and electrically connected to the exposed terminals of the conductive traces; an encapsulation dam formed on the continuous peripheral portion of the core and surrounding the chip, wherein the dam comprises a shoulder portion adjacent to and flush with the solder mask layer, and a protruded support portion surrounding the shoulder portion and having a height larger than a thickness of the chip; a lid attached to the support portion of the dam for sealing the dam such that the chip is received in a space defined by the substrate, the dam and the lid; and a plurality of solder balls implanted on a side of the substrate opposite to the side mounted with the chip.

The above semiconductor package can be fabricated by the following steps, including: preparing a substrate having a core with a plurality of conductive traces formed on at least one surface of the core, each of the conductive traces having a terminal, and applying a solder mask layer over the surface of the core to cover the conductive traces, allowing the terminals to be exposed to outside of the solder mask layer, wherein the solder mask layer is formed an opening to expose a continuous peripheral portion on the surface of the core; forming an encapsulation dam on the continuous peripheral portion of the core, wherein the dam comprises a shoulder portion adjacent to and flush with the solder mask layer, and a protruded support portion surrounding the shoulder portion and forming a space encompassed by the dam; mounting at least one photosensitive chip on the substrate and in the space encompassed by the dam, and electrically connecting the chip to the exposed terminals of the conductive traces; attaching a lid to the support portion of the dam to seal the space such that the chip is received in the space defined by the substrate, the dam and the lid; and implanting a plurality of solder balls on a side of the substrate opposite to the side mounted with the chip.

The above semiconductor package according to the invention yields significant benefits. It is a characteristic feature that the encapsulation dam is formed on the continuous peripheral portion of the core of the substrate that is exposed via the opening of the solder mask layer, making the dam in direct contact with the core. This arrangement effectively enhances adhesion between the dam and the substrate since the dam and the core are both made of resin materials, such that delamination between the dam and the substrate can be eliminated. Moreover, the opening of the solder mask layer for exposing the peripheral portion of the core is larger in width by 0.1 to 1 mm (preferably 0.5 mm) than a cavity of a mold for forming the support portion of the dam, such that a resin compound for fabricating the dam quickly absorbs heat from the mold and increases its viscosity when flowing to the opening and approaching the edge of the solder mask layer, thereby not flashing out of the opening and over unintended area on the substrate. As a result, the chip and bonding wires would not be mounted on flash-contaminated area on the substrate, and reliability and electrical connection can be assured for the semiconductor package.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

The preferred embodiments of a semiconductor package with a photosensitive chip and a fabrication method thereof proposed in the present invention are described with reference to FIGS. 1, 2A–2D and 3A–3D.

Figure 1:
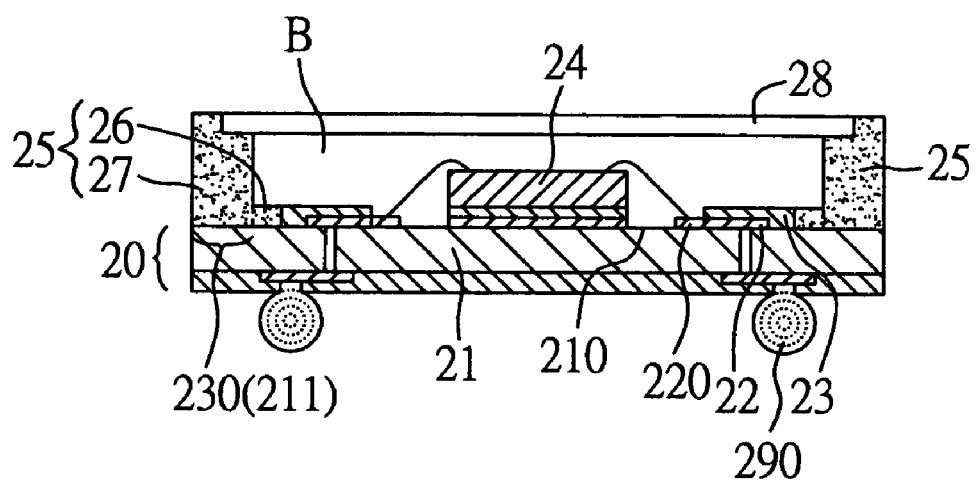
FIG. 1 is a cross-sectional view of a semiconductor package according to the invention.

As shown in FIG. 1, the semiconductor package according to the invention includes a substrate 20 having a core 21 with a plurality of conductive traces 22 formed on at least one surface 210 of the core 21, each conductive trace 22 having a terminal 220, wherein a solder mask layer 23 is applied over the surface 210 of the core 21 and covers the conductive traces 22, allowing the terminals 220 to be exposed to outside of the solder mask layer 23, and the solder mask layer 23 is formed with an opening 230 to expose a continuous peripheral portion 211 on the surface 210 of the core 21; at least one photosensitive chip 24 mounted on the substrate 20 and electrically connected to the exposed terminals 220 of the conductive traces 22; an encapsulation dam 25 formed on the continuous peripheral portion 211 of the core 21 and surrounding the chip 24, wherein the dam 25 comprises a shoulder portion 26 adjacent to and flush with the solder mask layer 23, and a protruded support portion 27 surrounding the shoulder portion 26 and having a height larger than a thickness of the chip 24; a lid 28 attached to the support portion 27 of the dam 25 for sealing the dam 25 such that the chip 24 is received in a space B defined by the substrate 20, the dam 25 and the lid 28; and a plurality of solder balls 290 implanted on a side of the substrate 20 opposite to the side mounted with the chip 24.

The above semiconductor package can be fabricated by a series of procedural steps illustrated in FIGS. 2A–2D.

Figure 2A:
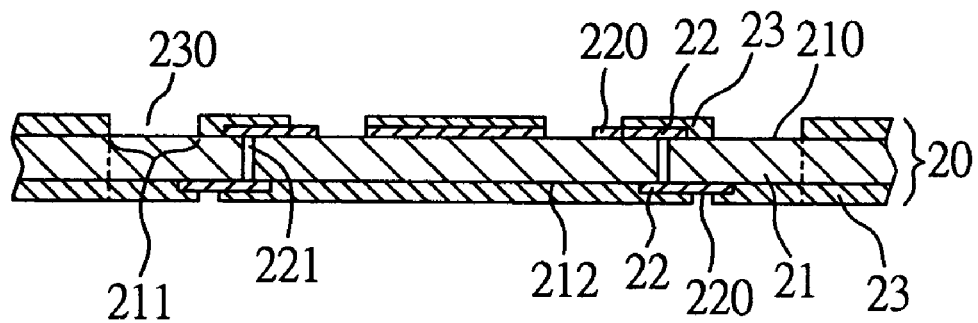
FIGS. 2A–2D are schematic diagrams showing a series of procedural steps for fabricating the semiconductor package shown in FIG. 1.
Figure 2A:
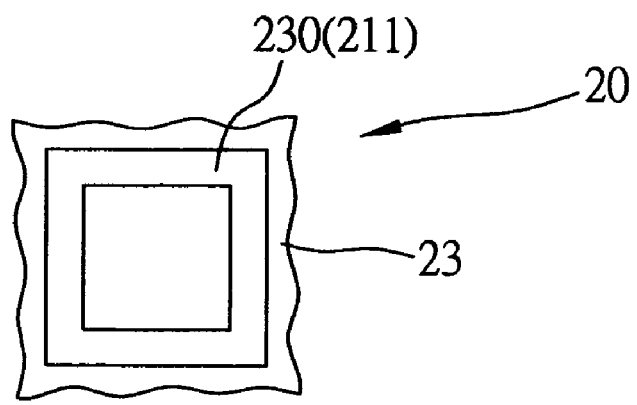

Referring to FIG. 2A (cross-sectional view and simplified top view), the first step is to prepare a substrate 20. The substrate 20 has a core 21 primarily made of a conventional resin material such as epoxy resin, polyimide resin, BT (bismaleimide triazine) resin, FR4 resin, etc. A plurality of conductive traces 22 are formed respectively on two opposite surfaces 210, 212 of the core 21, each conductive trace 22 having a terminal 220. The conductive traces 22 on opposite surfaces 210, 212 of the core 21 are electrically interconnected by conductive vias 221. The conductive traces 22 are fabricated by conventional technology, such as exposure, development and etching, thereby not further to be detailed. Then, a solder mask layer 23 (around 25 to 50 µm thick) is applied respectively over the surfaces 210, 212 of the core 21 and covers the conductive traces 22, allowing the terminals 220 to be exposed to outside of the solder mask layer 23, wherein the exposed terminals 220 on the surface 210 (upper surface) of the core 21 serve as bond fingers, and the exposed terminals 220 on the surface 212 (lower surface) of the core 21 serve as ball pads in subsequent fabrication processes. The solder mask layer 23 is formed an opening 230 to expose a continuous peripheral portion 211 on the upper surface 210 of the core 21; the simplified top view (lower-part drawing) in FIG. 2A is to primarily illustrate the opening 230 of the solder mask layer 23 or the exposed continuous peripheral portion 211 of the core 21.

Figure 2B:
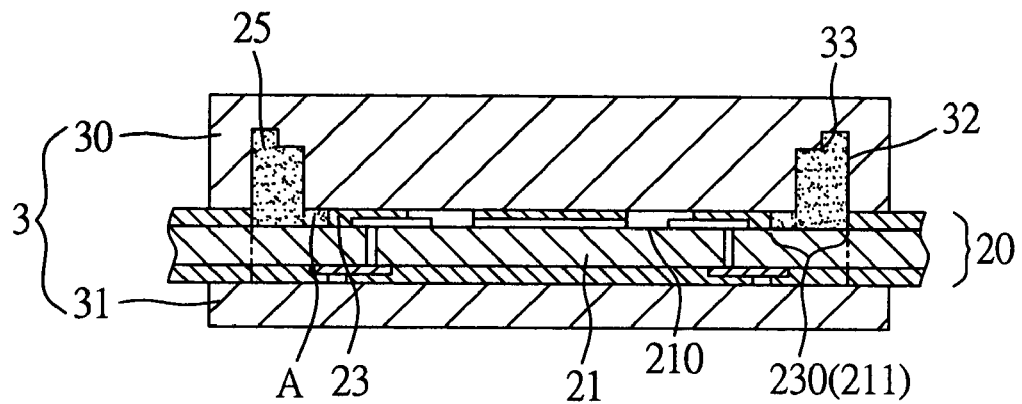

Referring to FIG. 2B, the next step is to perform a molding process using an encapsulation mold 3 having an upper mold 30 and a flat lower mold 31. The upper mold 30 is formed with an upwardly-recessed cavity 32; from a cross-sectional view, a protrusion 33 is preferably formed at an inner-upper corner of the cavity 32 which is located relatively closer to the center of the mold 3. The above substrate 20 is placed in the encapsulation mold 3 and clamped between the upper and lower molds 30, 31, with the upwardly-recessed cavity 32 corresponding to the continuous peripheral portion 211 on the core 21 of the substrate 20. The width of the cavity 32 is smaller than the width of the opening 230 of the solder mask layer 23 for exposing the peripheral portion 211 by around 0.1 to 1 mm, preferably 0.5 mm, such that a portion A of the opening 230 defined by the solder mask layer 23 and the upper mold 30 is relatively small and sized correspondingly to the thickness of the solder mask layer 23 of 25 to 50 µm. Then, a conventional resin compound (such as epoxy resin, etc.) is injected into and fills the upwardly-recessed cavity 32 of the upper mold 30 and the opening 230 of the solder mask layer 23, so as to form an encapsulation dam 25 on the core 21 of the substrate 20. When the resin compound flows to the small portion A of the opening 230 and approaches the edge of the solder mask layer 23, such a small space makes the resin compound quickly absorb heat from the encapsulation mold 3 and increase its viscosity thereby slowing down its flow speed. As a result, the resin compound would be confined within the portion A and stop further flashing out of the opening 230 or into the interface between the upper mold 30 and the substrate 20, such that predetermined area such as chip-attach area on the substrate 20 is free of contamination from the resin flash.

Figure 2C:
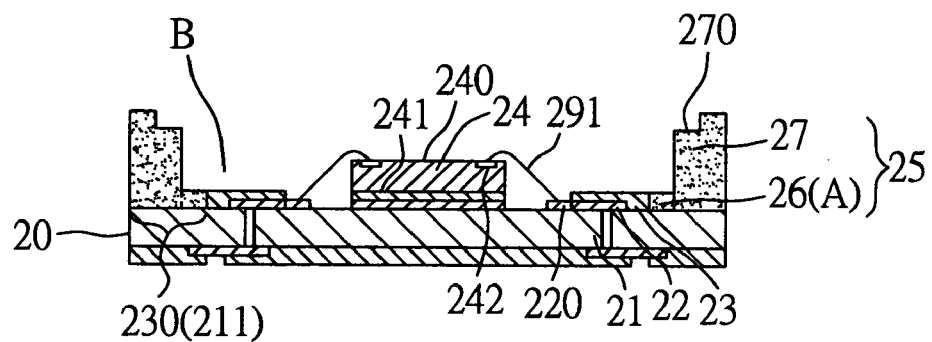

After the resin compound is cured, the encapsulation mold 3 can be removed from the substrate 20, and the encapsulation dam 25 is completely fabricated, as shown in FIG. 2C. The encapsulation dam 25 is directly formed on the core 21 of the substrate 20 and comprises a shoulder portion 26 and a protruded support portion 27. The shoulder portion 26 corresponds to the portion A of the opening 230 filled with the resin compound, such that the shoulder portion 26 is adjacent to and flush with the solder mask layer 23. The protruded support portion 27 corresponds to the upwardly-recessed cavity 32 of the upper mold 30 filled with the resin compound. Therefore, the protruded support portion 27 surrounds the shoulder portion 26 and encompasses a space B on the substrate 20. By the provision of the protrusion 33 in the upwardly-recessed cavity 32, a corresponding recess 270 is formed at an inner-upper corner of the support portion 27.

Further referring to FIG. 2C, after the encapsulation dam 25 is fabricated, at least one photosensitive chip 24 such as CMOS (complementary metal oxide semiconductor) chip is mounted on the substrate 20 and within the space B defined by the dam 25. The chip 24 has an active surface 240 and an opposite inactive surface 241, wherein the active surface 240 is formed with a plurality of electronic elements and circuits (not shown) and bond pads 242 thereon, and the inactive surface 241 of the chip 24 is attached to the substrate 20. Then, a wire-bonding process is performed to form a plurality of bonding wires 291 such as gold wires, allowing the bonding wires 291 to be bonded to the bond pads 242 on the active surface 240 of the chip 24 and to the exposed terminals or bond fingers 220 on the upper surface 210 of the core 21, such that the chip 24 is electrically connected to the substrate 20 via the bonding wires 291.

Figure 2D:
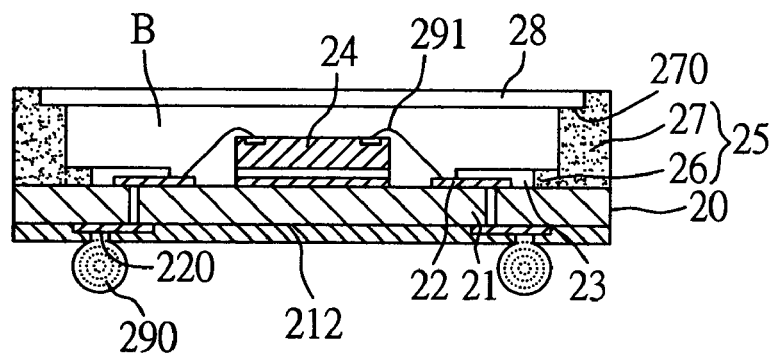

Referring to FIG. 2D, a lid 28 is attached to the support portion 27 of the dam 25 and engaged with the recess 270 of the support portion 27 to seal the space B, such that the chip 24 and bonding wires 291 are received in the space B defined by the substrate 20, the dam 25 and the lid 28. The lid 28 hermetically isolates the chip 24 and bonding wires 291 from the external atmosphere. The lid 28 is made of a light-permeable or transparent material to allow light to go through the lid 28 and reach the chip 24 that requires light for operation. Finally, a plurality of solder balls 290 are implanted on the exposed terminals or ball pads 220 on the lower surface 212 of the core 21 of the substrate 20. The solder balls 290 serves as I/O (input/output) connections for allowing the chip 24 to be electrically connected to an external device such as printed circuit board (not shown).

In another embodiment, the semiconductor package according to the invention can be fabricated by another series of procedural steps in a batch manner illustrated in FIGS. 3A–3D.

Figure 3A:
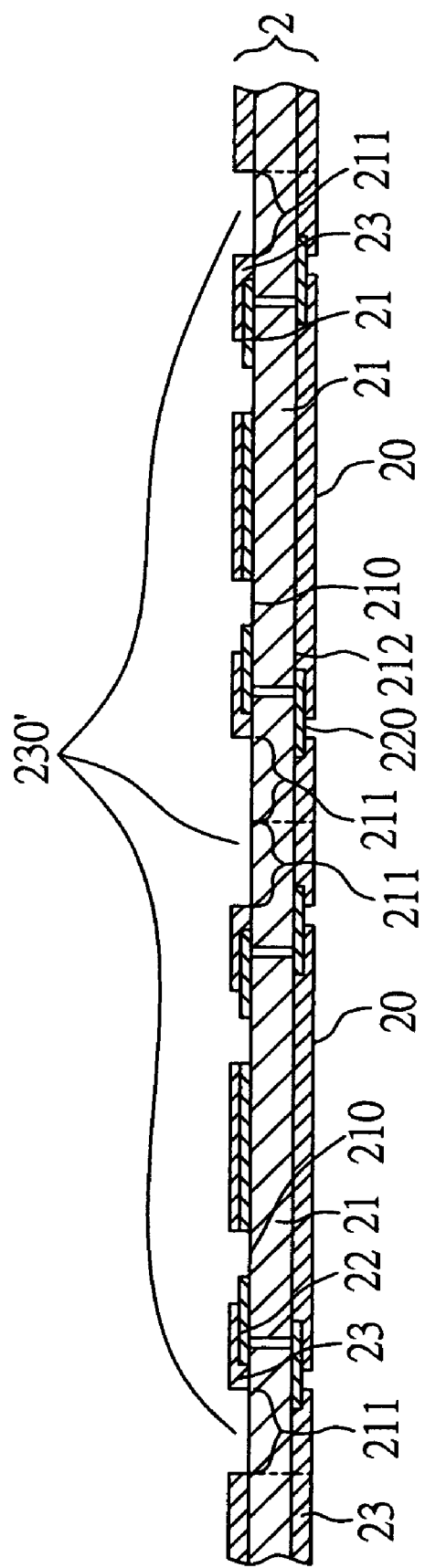
FIGS. 3A–3D are schematic diagrams showing another series of procedural steps for fabricating the semiconductor package shown in FIG. 1.

Referring to FIG. 3A, the first step is to prepare a substrate plate 2 comprising an array of the above substrates 20 that are integrally formed. The substrates 20 have the same structure as the foregoing description of FIG. 2A, thereby not further to be detailed here. The solder mask layer 23 is formed with an opening 230' (preferably grid-shaped) to expose a continuous peripheral portion 211 on the upper surface 210 of the core 21 for each of the substrates 20, with the adjacent substrates 20 having their exposed peripheral portion 211 interconnected.

Figure 3B:
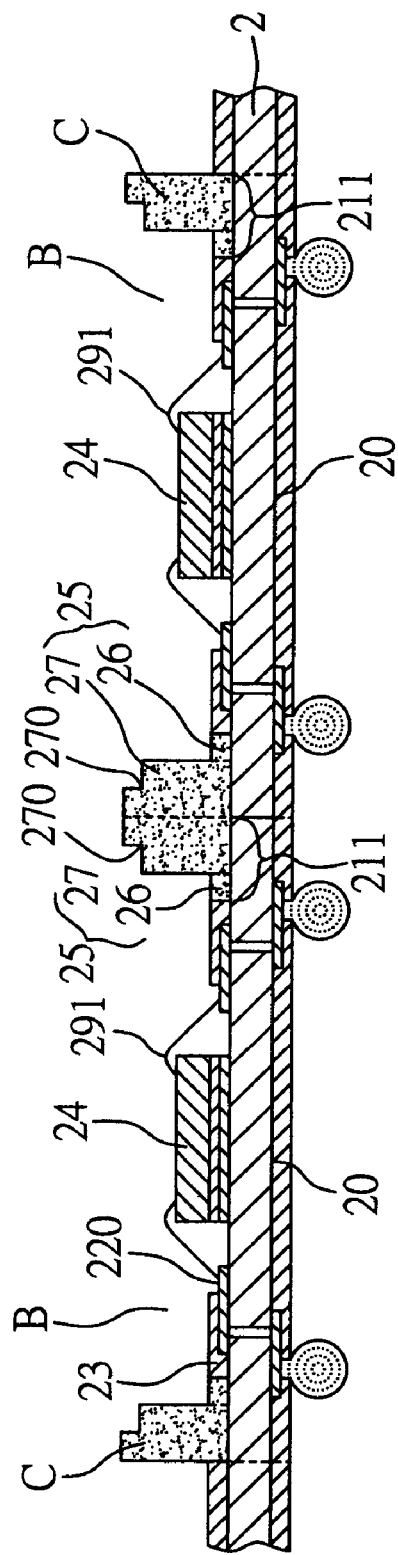

Referring to FIG. 3B, the next step is to form an encapsulation body C comprising a plurality of interconnected encapsulation dams 25 each on the continuous peripheral portion 211 of the corresponding substrate 20. Similarly, each encapsulation dam 25 comprises a shoulder portion 26 adjacent to and flush with the solder mask layer 23, and a protruded support portion 27 surrounding the shoulder portion 26 and encompassing a space B on the substrate 20. It should be noted that the adjacent dams 25 have their support portions 27 interconnected. Preferably, a pair of the interconnected support portions 27 have their recesses 270 located at the corresponding exposed corners; for example, the right support portion 27 with respect to a boundary line (the dotted line in the drawing) has its recess 270 at the upper-right corner, while the recess 270 of the left support portion 27 is located at the upper-left corner.

Then, at least one chip 24 is mounted on each of the substrates 20 and within the space B defined by the corresponding dam 25. The chip 24 is electrically connected to the corresponding substrate 20 via a plurality of bonding wires 291 formed on the upper surface 210 of the core 21. A plurality of solder balls 290 are implanted on the exposed terminals or ball pads 220 on the lower surface 212 of the core 21 for each of the substrates 20.

Figure 3C:
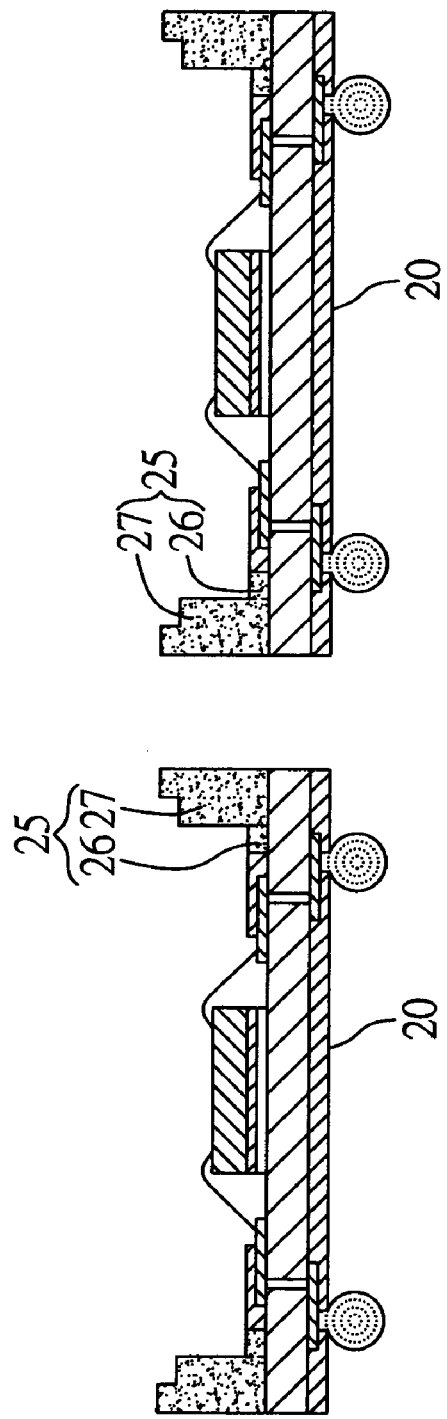

Referring to FIG. 3C, a singulation process is performed to cut through the interconnected support portions 27 of the adjacent dams 25 and the substrate plate 2 along the boundary lines (dotted lines shown in FIG. 3B) to separate apart the substrates 20.

Figure 3D:
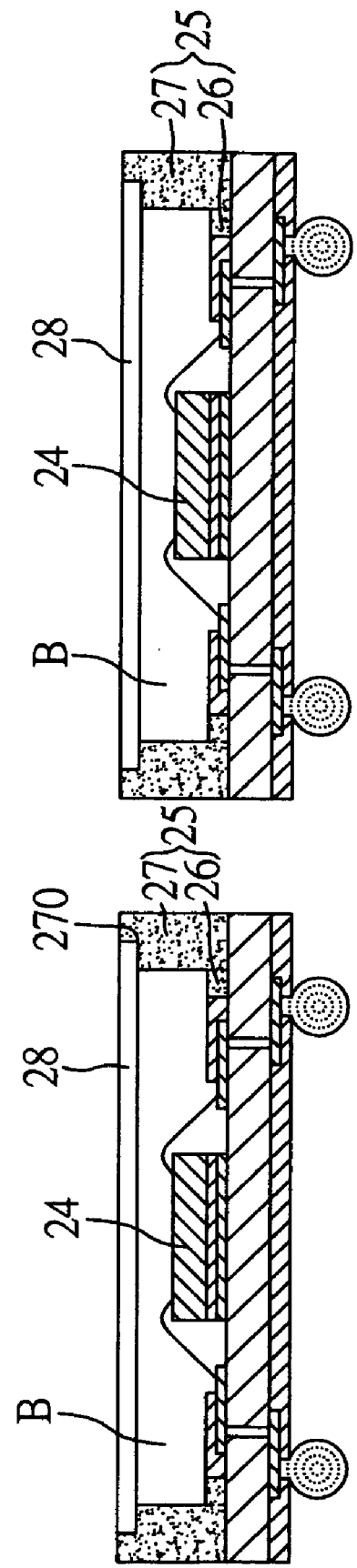
Figure 4:
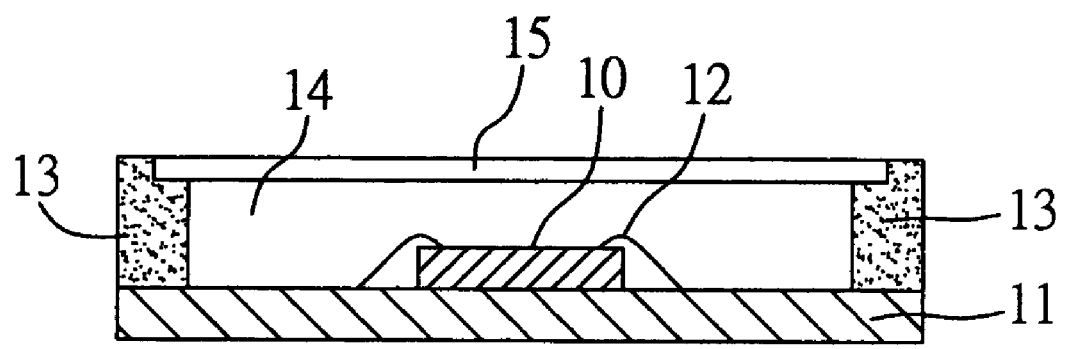
FIG. 4 (PRIOR ART) is a cross-sectional view of a conventional semiconductor package.

Finally referring to FIG. 3D, a lid 28 is attached to the recess 270 of the support portion 27 of the dam 25 for each of the substrates 20 to seal the dam 25, making the corresponding chip 24 received in the space B defined by the substrate 20, the dam 25 and the lid 28. This thereby fabricates a plurality of individual semiconductor packages according to the present invention.

The above semiconductor package according to the invention yields significant benefits. It is a characteristic feature that the encapsulation dam is formed on the continuous peripheral portion of the core of the substrate that is exposed via the opening of the solder mask layer, making the dam in direct contact with the core. This arrangement effectively enhances adhesion between the dam and the substrate since the dam and the core are both made of resin materials, such that delamination between the dam and the substrate can be eliminated. Moreover, the opening of the solder mask layer for exposing the peripheral portion of the core is larger in width by 0.1 to 1 mm (preferably 0.5 mm) than the cavity of the mold for forming the support portion of the dam, such that the resin compound quickly absorbs the heat from the mold and increases its viscosity when flowing to the opening and approaching the edge of the solder mask layer, thereby not flashing out of the opening and over unintended area on the substrate. As a result, the chip and bonding wires would not be mounted on flash-contaminated area on the substrate, and reliability and electrical connection can be assured for the semiconductor package.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A semiconductor package with a photosensitive chip, comprising:
   a substrate having a core with a plurality of conductive traces formed on at least one surface of the core, each of the conductive traces having a terminal, wherein a solder mask layer is applied over the surface of the core and covers the conductive traces, allowing the terminals to be exposed to outside of the solder mask layer, and the solder mask layer is formed with an opening to expose a peripheral portion on the surface of the core;

at least one photosensitive chip mounted on the substrate and electrically connected to the exposed terminals of the conductive traces;

an encapsulation dam formed on the peripheral portion of the core and surrounding the chip, wherein the dam comprises a shoulder portion adjacent to and flush with the solder mask layer, and a protruded support portion surrounding the shoulder portion and having a height larger than a thickness of the chip; and a lid attached to the support portion of the dam for sealing the dam such that the chip is received in a space defined by the substrate, the dam and the lid.

2. The semiconductor package of claim 1, further comprising a plurality of solder balls implanted on a side of the substrate opposite to the side mounted with the chip.

3. The semiconductor package of claim 1, wherein the shoulder portion of the dam has a width of from 0.1 to 1 mm.

4. The semiconductor package of claim 3, wherein the width of the shoulder portion is 0.5 mm.

5. The semiconductor package of claim 1, wherein each of the terminals serves as a bond finger where a bonding wire is bonded to electrically connect the chip to the substrate.

6. The semiconductor package of claim 1, wherein the core is made of a material selected from the group consisting of epoxy resin, polyimide resin, BT (bismaleimide triazine) resin, and FR4 resin.

7. The semiconductor package of claim 1, wherein the dam is made of a resin compound.

8. A fabrication method of a semiconductor package with a photosensitive chip, comprising the steps of:

preparing a substrate having a core with a plurality of conductive traces formed on at least one surface of the core, each of the conductive traces having a terminal, and applying a solder mask layer over the surface of the core to cover the conductive traces, allowing the terminals to be exposed to outside of the solder mask layer, wherein the solder mask layer is formed an opening to expose a peripheral portion on the surface of the core;

forming an encapsulation dam on the peripheral portion of the core, wherein the dam comprises a shoulder portion adjacent to and flush with the solder mask layer, and a protruded support portion surrounding the shoulder portion and forming a space encompassed by the dam;

mounting at least one photosensitive chip on the substrate and in the space encompassed by the dam, and electrically connecting the chip to the exposed terminals of the conductive traces; and attaching a lid to the support portion of the dam to seal the space such that the chip is received in the space encompassed by the dam, the substrate and the lid.

9. The fabrication method of claim 8, further comprising implanting a plurality of solder balls on a side of the substrate opposite to the side mounted with the chip.

10. The fabrication method of claim 8, wherein the shoulder portion of the dam has a width of from 0.1 to 1 mm.

11. The fabrication method of claim 10, wherein the width of the shoulder portion is 0.5 mm.

12. The fabrication method of claim 8, wherein each of the terminals serves as a bond finger where a bonding wire is bonded to electrically connect the chip to the substrate.

13. The fabrication method of claim 8, wherein the core is made of a material selected from the group consisting of epoxy resin, polyimide resin, BT (bismaleimide triazine) resin, and FR4 resin.

14. The fabrication method of claim 8, wherein the dam is made of a resin compound.

15. A fabrication method of a semiconductor package with a photosensitive chip, comprising the steps of:

preparing a substrate plate comprising an array of substrates, the substrate plate having a core with a plurality of conductive traces formed on at least one surface of the core, each of the conductive traces having a terminal, and applying a solder mask layer over the surface of the core to cover the conductive traces, allowing the terminals to be exposed to outside of the solder mask layer, wherein the solder mask layer is formed with an opening to expose a peripheral portion on the surface of the core for each of the substrates;

forming an encapsulation body comprising a plurality of interconnected encapsulation dams each on the peripheral portion of the corresponding substrate, wherein each of the encapsulation dams comprises a shoulder portion adjacent to and flush with the solder mask layer, and a protruded support portion surrounding the shoulder portion and forming a space encompassed by the dam, the adjacent dams having the support portions thereof interconnected;

mounting at least one photosensitive chip on each of the substrates and in the space encompassed by each of the dams, and electrically connecting the chip to the exposed terminals of the conductive traces;

cutting through the interconnected support portions of the adjacent dams and the substrate plate to separate apart the substrates; and attaching a lid to the support portion of the dam on each of the substrates to seal the dam such that the chip is received in the space encompassed by the dam, the substrate and the lid.

16. The fabrication method of claim 15, further comprising implanting a plurality of solder balls on a side of each of the substrates opposite to the side mounted with the chip.

17. The fabrication method of claim 15, wherein the shoulder portion of the dam has a width of from 0.1 to 1 mm.

18. The fabrication method of claim 17, wherein the width of the shoulder portion is 0.5 mm.

19. The fabrication method of claim 15, wherein each of the terminals serves as a bond finger where a bonding wire is bonded to electrically connect the chip to the substrate.

20. The fabrication method of claim 15, wherein the encapsulation body is made of a resin compound.

* * * * *